US010957632B2

(12) United States Patent
Yandoc et al.

(10) Patent No.: US 10,957,632 B2
(45) Date of Patent: Mar. 23, 2021

(54) LEAD FRAME ASSEMBLY FOR A SEMICONDUCTOR DEVICE

(71) Applicant: NEXPERIA B.V., Nijmegen (NL)

(72) Inventors: Ricardo Lagmay Yandoc, Nijmegen (NL); Adam Richard Brown, Nijmegen (NL); Arnel Biando Taduran, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/447,123

(22) Filed: Jun. 20, 2019

(65) Prior Publication Data

US 2019/0393137 A1 Dec. 26, 2019

(30) Foreign Application Priority Data

Jun. 20, 2018 (EP) .................................... 18178832

(51) Int. Cl.
*H01L 23/495* (2006.01)
*H01L 21/50* (2006.01)
*H01L 23/31* (2006.01)

(52) U.S. Cl.
CPC ........ *H01L 23/49513* (2013.01); *H01L 21/50* (2013.01); *H01L 23/3121* (2013.01); *H01L 23/49568* (2013.01)

(58) Field of Classification Search
None
See application file for complete search history.

(56) References Cited

U.S. PATENT DOCUMENTS

| 6,924,175 B2* | 8/2005 | Pavier ............... H01L 23/49551 257/E23.044 |
| 2010/0059875 A1* | 3/2010 | Sato .................. H01L 23/49575 257/690 |
| 2011/0227205 A1 | 9/2011 | Lu et al. |

(Continued)

FOREIGN PATENT DOCUMENTS

WO 2009029397 A1 3/2009

OTHER PUBLICATIONS

Extended European Search Report and Written Opinion for corresponding European application EP 18178832.4, 8 pages, dated Nov. 30, 2018.

*Primary Examiner* — Sitaramarao S Yechuri
(74) *Attorney, Agent, or Firm* — Ohlandt, Greeley, Ruggiero & Perle, LLP

(57) ABSTRACT

The disclosure relates to a lead frame assembly for a semiconductor device, the lead frame assembly including: a die attach structure and clip frame structure. The clip frame structure includes: a die connection portion configured to contact to one or more contact terminals on a top side of the semiconductor die; one or more electrical leads extending from the die connection portion at a first end, and a lead supporting member extending from a second end of the one or more leads; and a plurality of clip support members arranged orthogonally to the one or more electrical leads. The plurality of support members and the lead supporting member are configured to contact the die attach structure. The present disclosure also relates a die attach structure and clip frame structure for a semiconductor device, a semiconductor device including the same and a method of manufacturing the semiconductor device.

19 Claims, 8 Drawing Sheets

(56) References Cited

U.S. PATENT DOCUMENTS

| | | | |
|---|---|---|---|
| 2013/0005083 A9* | 1/2013 | Liu | H01L 23/49551 |
| | | | 438/107 |
| 2013/0069213 A1 | 3/2013 | Sohn et al. | |
| 2014/0154843 A1* | 6/2014 | Liu | H01L 23/49568 |
| | | | 438/123 |
| 2015/0001695 A1* | 1/2015 | Hebert | H01L 23/49524 |
| | | | 257/675 |
| 2015/0214139 A1 | 7/2015 | Miyakawa | |
| 2016/0064291 A1* | 3/2016 | Ishii | H01L 24/97 |
| | | | 438/15 |
| 2017/0236754 A1* | 8/2017 | Shibuya | H01L 21/561 |
| | | | 438/112 |

* cited by examiner

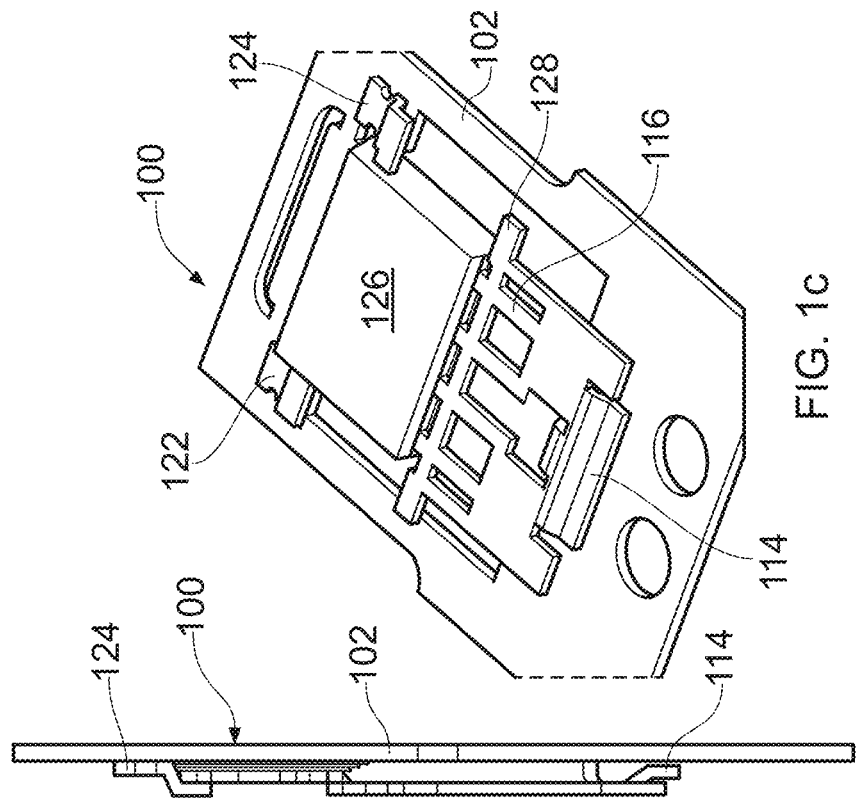
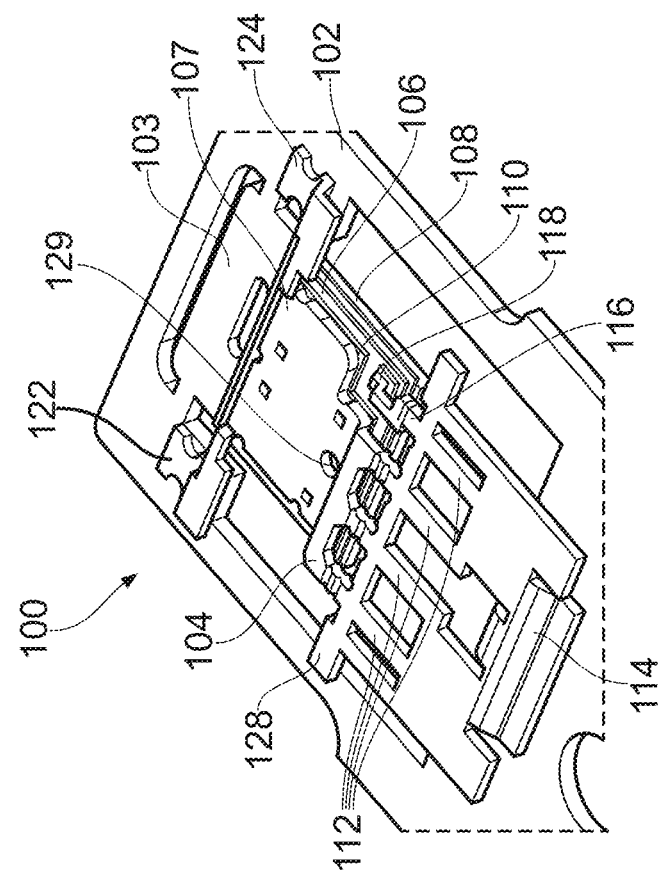
FIG. 1c
FIG. 1b
FIG. 1a

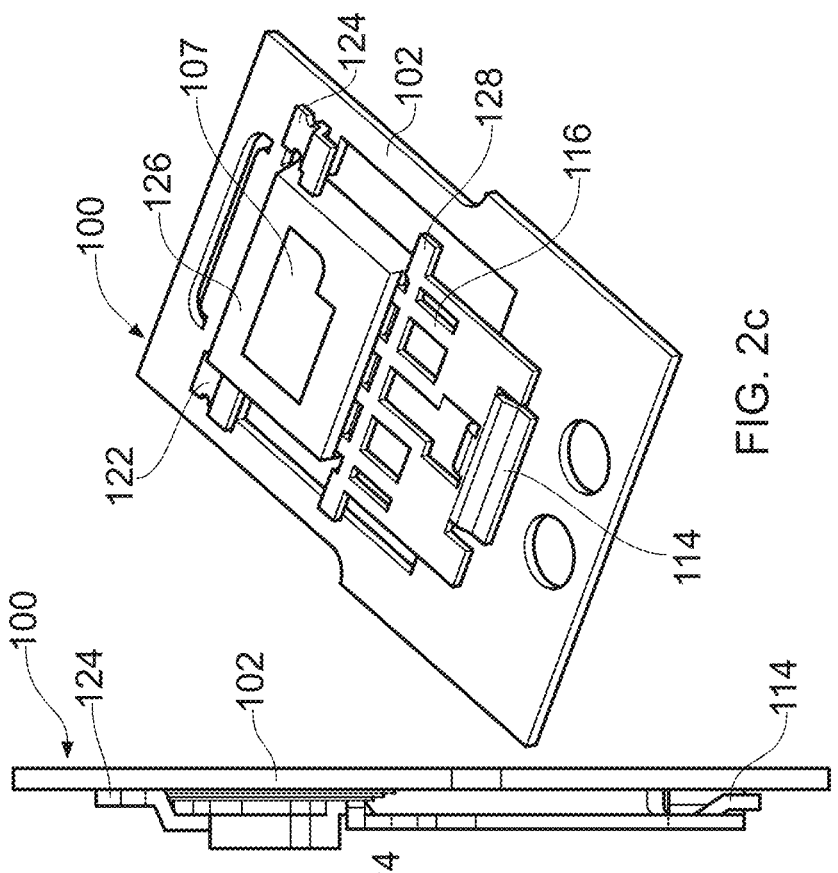
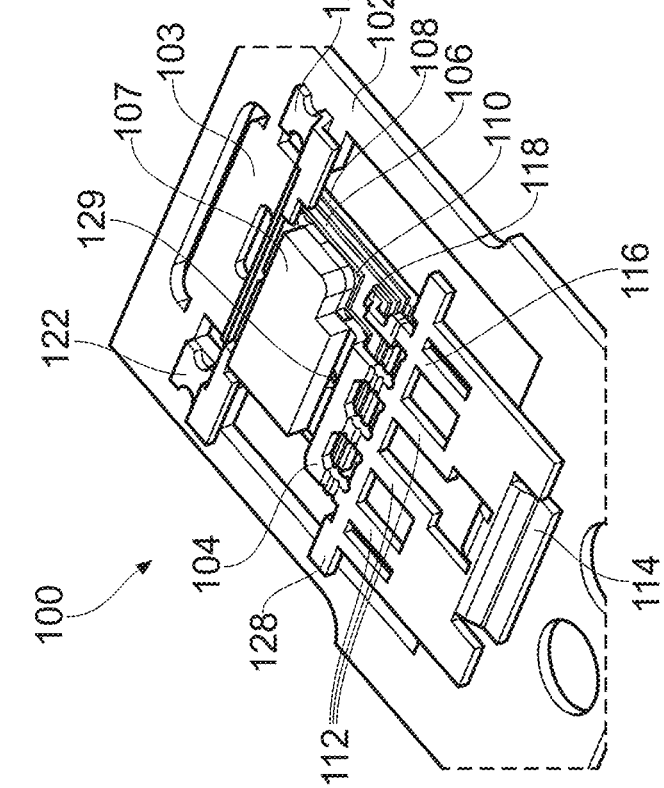
FIG. 2c
FIG. 2b
FIG. 2a

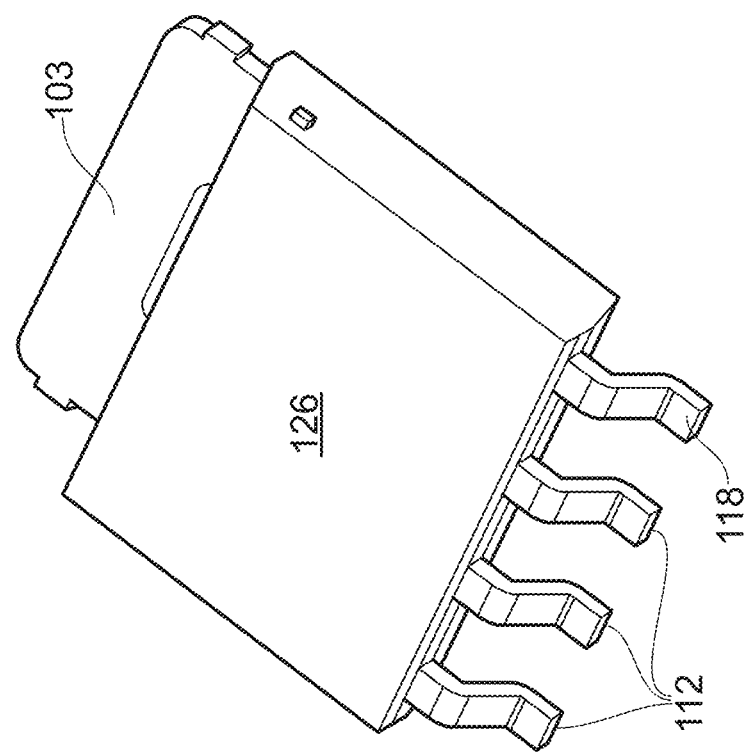
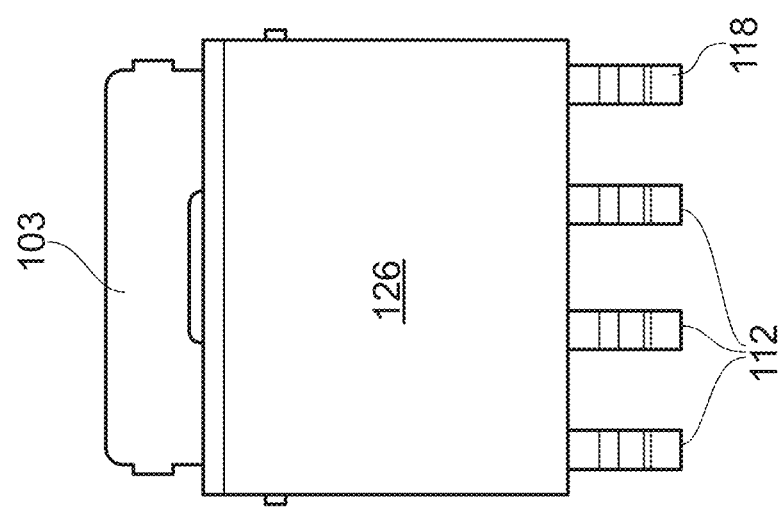

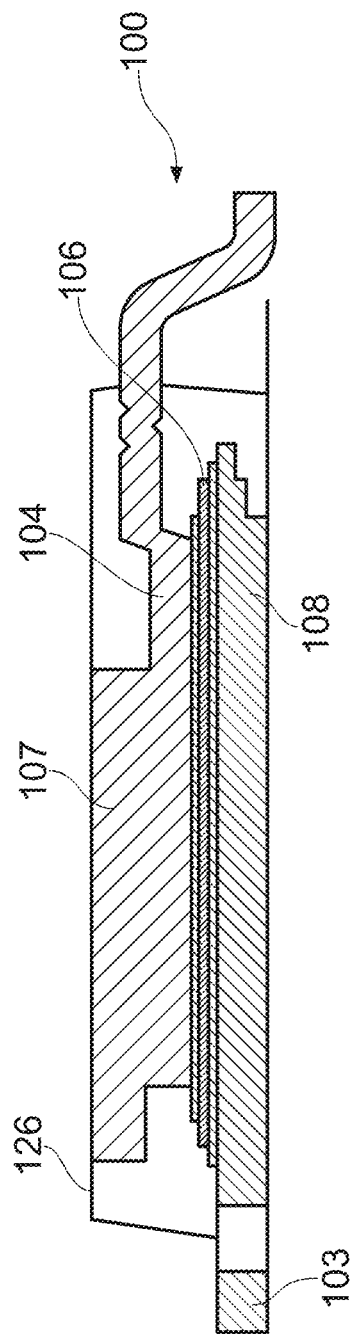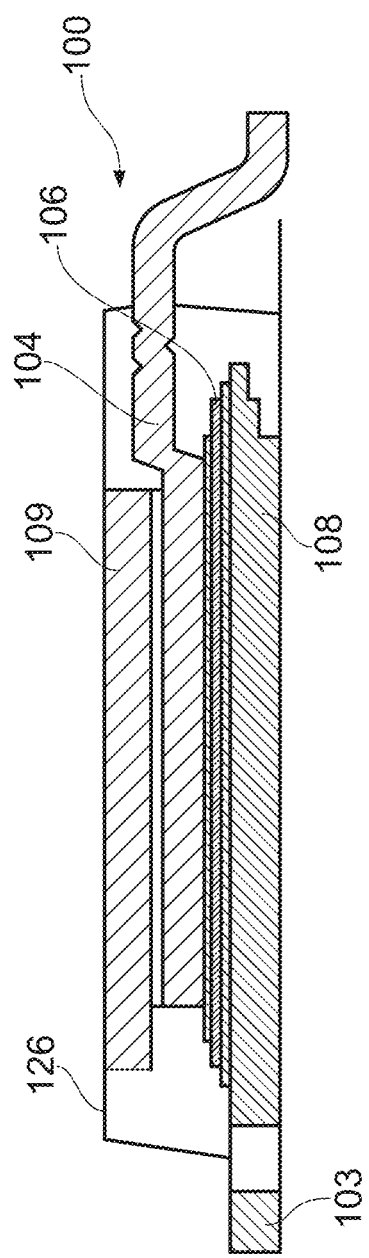

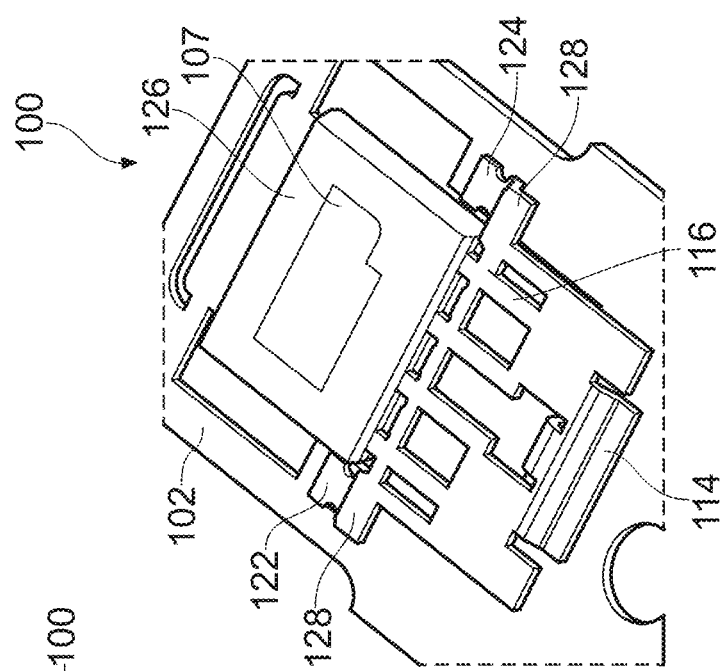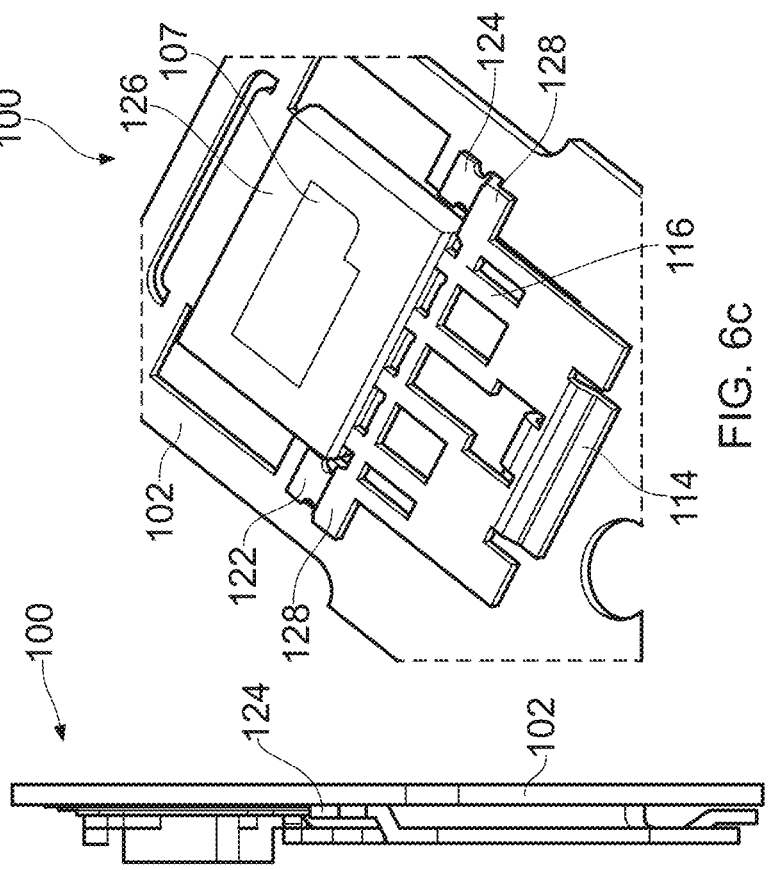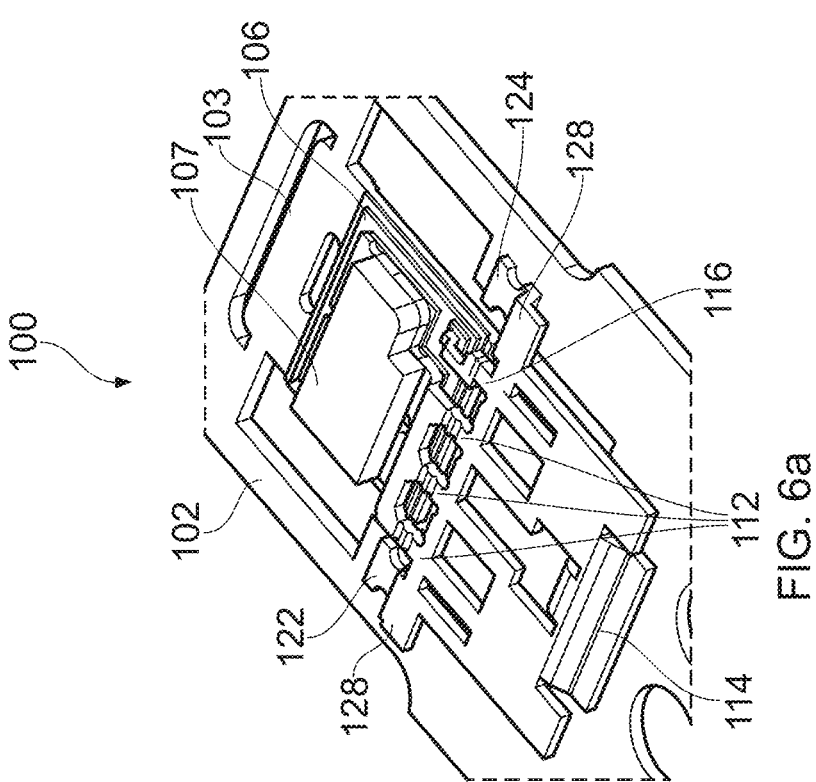

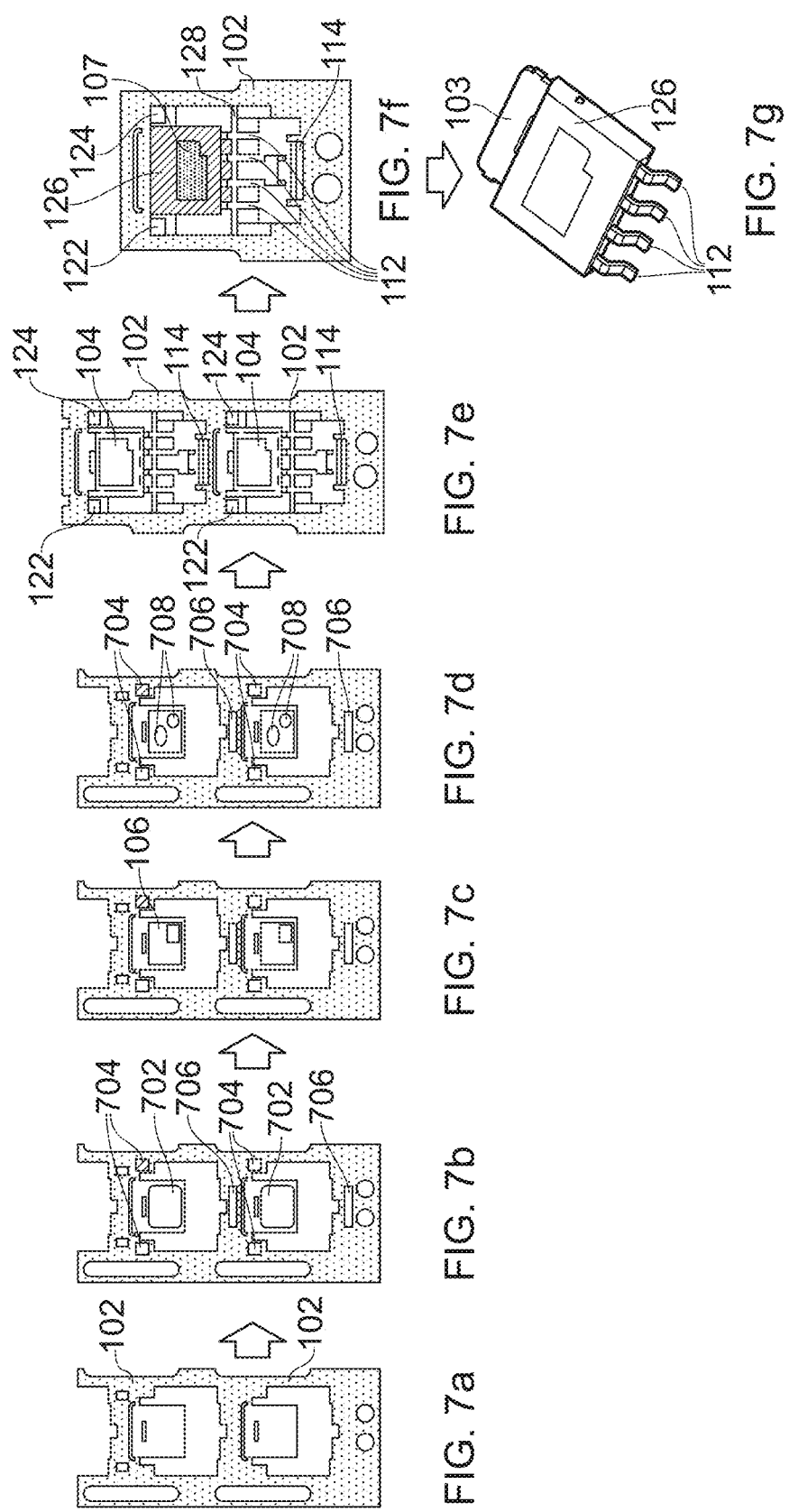

FROM FIG. 7e

LEAD FRAME ASSEMBLY FOR A SEMICONDUCTOR DEVICE

CROSS REFERENCE TO RELATED APPLICATIONS

This application claims benefit under 35 U.S.C. 119(a) of European Patent Application No. 18178832.4 filed Jun. 20, 2018, the entire contents of which are incorporated herein by reference.

BACKGROUND OF THE DISCLOSURE

1. Field of the Disclosure

The present disclosure relates to a lead frame assembly for a semiconductor device. In particular the present disclosure relates a die attach structure and a clip frame structure for a semiconductor device, a semiconductor device comprising the same and an associated method of manufacturing the semiconductor device.

2. Description of Related Art

In semiconductor devices, clip bonded packages are commonly used to make connections from a semiconductor die to external contacts of the device. Clip bonded packages have a number of advantages over conventional wire bonded packages. For example, clip bonded packages are typically used for mechanically robust and reliable electrical connections to and from the semiconductor die in automotive applications. Furthermore, the conductive clip material may have increased thermal mass compared to the wire bond material and can thus act as a heat sink for the semiconductor die.

However, rotational or tilting misplacement of the clip relative to the semiconductor die can occur when mounting and attaching the clip on the semiconductor die. This misplacement can result in reduced functionality or failure of the semiconductor device. The misplacement or tilting may occur due to the nature of the connection of the clip to semiconductor die. Typically the connection of the clip to the semiconductor die is achieved by way of a bonding material such as a solder or a conductive adhesive dispensed on the semiconductor die, following which the clip is placed on the solder or conductive adhesive, forming a so-called bond line. Due to the weight of the clip applying a downward pressure on the solder or a conductive adhesive the bond-line thickness may not be uniform across its area and may cause the clip to be tilted with respect to the semiconductor die. In other words the bottom surface of the clip, that is the surface facing the semiconductor die, is not parallel with the top surface of the semiconductor die.

In certain applications it may be desirable to increase the thickness of the clip material to increase the thermal mass of and thus provide a larger heat sink for the semiconductor die. The increased thickness may also allow a top surface of the clip to be exposed through a top surface of the semiconductor device package material. However, the increased weight associated with the increased thickness of the clip may result in increased downward pressure on the solder or conductive adhesive which may result in increased non-uniformity of the bond line thickness across the area of the bond line. This non-uniformity may lead to unwanted tilting or rotation of the clip as discussed above. Also exposure of the heatsink as described above combined with the tilting of the clip may result in unwanted mould flashing on the heat sink following packaging.

Typically, any unwanted mould flashing is removed, post moulding, using a mechanical abrasive force such as grinding or polishing. However, the use of mechanical forces to remove excessive mould flashing can potentially cause damaging separation of the moulding material, which encapsulates the semiconductor die and lead frame, from the semiconductor die and/or die attach structure and this separation can ultimately result in failure of the semiconductor device.

Furthermore, tilting of the clip with respect to the semiconductor die may result in one end of the clip being higher than the other and may result in mould compound entering any gaps between the top of mould cavity and the clip during the moulding process.

SUMMARY

According to a first aspect there is provided a lead frame assembly for a semiconductor device, the lead frame assembly comprising: a die attach structure and a clip frame structure; the clip frame structure comprising: a die connection portion configured and arranged for contacting to one or more contact terminals on a top side of the semiconductor die; one or more electrical leads extending from the die connection portion at a first end, and a lead supporting member extending from a second end of the one or more leads; and a plurality of clip support members arranged orthogonally to the one or more electrical leads, wherein the plurality of support members and the lead supporting member are configured and arranged to contact the die attach structure.

Optionally, the plurality of clip support members may be arranged on the die connection portion.

Optionally, the plurality of clip support members are arranged on the one or more electrical leads between the die connection portion and the lead supporting member.

According to embodiments the lead frame assembly may optionally further comprise a dam bar extending orthogonally across the one or more electrical leads wherein each one of the clip support members are integrally formed at a respective end of the dam bar.

Optionally, the clip frame structure is formed of a single unitary piece of conductive material.

According to embodiments the lead frame assembly may optionally further comprise a heat sink member arranged on the die connection portion.

According to a second aspect there is provided a semiconductor device comprising the lead frame assembly according to the first aspect and further comprising a semiconductor die arranged on the die attach structure and a moulding material encasing the semiconductor die.

Optionally, the die connection portion is connected to the top side contact portion of the semiconductor die using a bonding material.

Optionally, the thickness of the bonding material is substantially equal across the area of the bond and/or wherein the die connection portion is substantially parallel to a top side of the semiconductor die.

According to embodiments, the top surface of heat sink member is substantially coplanar with a top surface of the moulding material.

Optionally, the heat sink member is attached to the die connection portion using a bonding material and/or a die attach structure is attached to a backside contact portion of the semiconductor die using a bonding material.

According to a third aspect there is provided a method of manufacturing a semiconductor device, the method comprising: providing a die attach structure; fixing a semiconductor die to the die attach structure; attaching a clip frame structure to the die attach structure and the semiconductor die; wherein the clip frame structure comprises: a die connection portion configured and arranged for contacting to one or more contact terminals on a top side of the semiconductor die; one or more electrical leads extending from the die connection portion at a first end, and a lead supporting member extending from a second end of the one or more leads; and a plurality of clip support members arranged orthogonally to the one or more electrical leads, wherein the plurality of support members and the lead support members are configured and arranged to contact the die attach structure.

Optionally, the clip support members are fixedly connected to the die attach structure.

BRIEF DESCRIPTION OF THE DRAWINGS

In the figures and the following description like reference numerals refer to like features.

The disclosure is described further hereinafter by way of example only with reference to the accompanying drawings in which:

FIG. 1a an arrangement of die attach structure and clip frame structure according to an embodiment where a single gauge clip frame structure is mounted on a die attach structure.

FIG. 1b illustrates side view of an arrangement of the die attach structure and clip frame structure according FIG. 1a.

FIG. 1c illustrates a further view the arrangement of FIG. 1a following moulding.

FIG. 2a an arrangement of die attach structure and clip frame structure according to an embodiment where a double gauge clip frame structure is mounted on a die attach structure.

FIG. 2b illustrates a side view of the plan view of FIG. 2a.

FIG. 2c illustrates a further view the arrangement of FIG. 2a following moulding.

FIG. 3b illustrates an isometric view of a completed semiconductor device according to FIG. 3a.

FIG. 4a illustrates a plan view of a completed semiconductor device according to embodiments.

FIG. 4b illustrates an isometric view of a completed semiconductor device according to FIG. 4a.

FIG. 5a illustrates a side view of a completed semiconductor device according to embodiments.

FIG. 5b illustrates a further side view of a completed semiconductor device according to embodiments.

FIG. 6a illustrates an arrangement of die attach structure and clip frame structure according to an embodiment where a double gauge clip frame structure is mounted on a die attach structure.

FIG. 6b illustrates a side view of the plan view of FIG. 6a.

FIG. 6c illustrates a further view the arrangement of FIG. 6a following moulding.

FIGS. 7a to 7g illustrate a process flow steps for manufacturing a semiconductor device according to an embodiment.

DETAILED DESCRIPTION

Figure 3B:
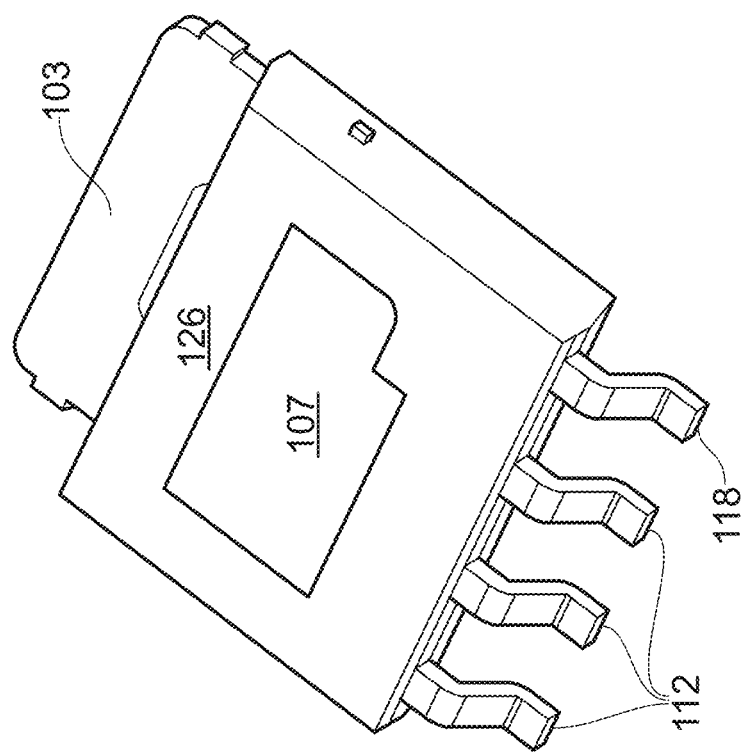

In overview, a semiconductor device 100 prior to moulding and singulation and comprising a lead frame structure according to an embodiment is illustrated in FIGS. 1a and 1b. The semiconductor device 100 generally comprises a die attach structure 102 and a clip frame structure 104, forming a lead frame assembly, and a semiconductor die 106 attached to the die attach structure 102 and the clip frame structure 104.

The die attach structure 102 is typically arranged for mounting a semiconductor die 106 thereon and providing support for the clip frame structure 104. In addition the die attach structure 102 may, depending on the arrangement of contact terminals, such as source, gate or drain, of semiconductor die 106 provide contact to a back or bottom contact of the semiconductor die 106. The die attach structure 102 is typically formed of a metallic conductive material, such as copper, thus providing an bottom external lead 103, such as a drain contact, to the back or bottom contact terminal of the semiconductor die 106. As illustrated in FIG. 1c, the bottom external lead 103 may extend outside of the mould material of the semiconductor device 100 to form a heat sink tab to the bottom of the semiconductor die 106. The clip frame structure comprises a heat sink portion 107 which also serves as a connection to a top contact of the semiconductor die 106.

The semiconductor die 106 is fixedly arranged on the die attach structure 102, and the clip frame structure 104 is fixedly connected to the semiconductor die 106 and the die attach structure 102. The heat sink portion 107 may be generally rectangular in shape and may be dimensioned such that it substantially matches the dimensions of the top contact terminal 110 of the semiconductor die 106 to which it is attached.

As discussed above, the bottom or backside contact terminal of the semiconductor die 106 may be fixedly attached to a die attach portion 108 of the die attach structure 102. The semiconductor die 106 may be fixedly attached to the die attach structure and may be electrically connected, via a bottom contact terminal (not illustrated) to the die attach structure using any suitable bonding material such as a solder or a conductive adhesive. The clip frame structure 104 is fixedly attached to a contact terminal 110 arranged on a top side of the semiconductor die 106, using an appropriate bonding material, such as for example, a solder or a conductive adhesive. The arrangement of bonding materials for connection of the semiconductor die 106 is more clearly illustrated in FIGS. 5a and 5c.

The clip frame structure 104 may further comprise one or more leads 112 extending from a first side thereof. At a first end, the one or more leads 112, 116 may be integrally formed with the heat sink portion 107. At a second end distal the first end, the leads 112 are connected to each other and arranged to form a support member 114, wherein the lead support member 114 is arranged to contact and be supported by the die attach structure 102. One or more optional leads 116 may be arranged to be connected to the support member 114, where the one or more optional leads may be connected to a further contact terminal 118, such as a gate terminal of the semiconductor die 106. A dam-bar may be integrally formed with the leads and may extend orthogonally across the one or more leads 112, 116. The lead support member 114 may be attached to the die attach structure 102 by an appropriate bonding material such as for example, a solder or conductive paste.

Following singulation of the semiconductor device as discussed in more detail below, the leads 112, 116 will be separated from the lead support member 114 to form external electrical contacts to the semiconductor die 106. The one or more leads 112, 118 may be suitable for connection to a carrier such as a printed circuit board (not illustrated).

A first clip support member 122 may be arranged to extend from a side of the heat sink portion 107 opposite the side from which the leads 112, 116 extend. A second clip support member 124 may also extend from the from a side of the heat sink portion 107 opposite the first clip support member 122. The function of the first and second clip support members 122, 124 is to provide support for the clip frame structure 104 on the die attach structure 102 thereby preventing the clip frame structure 104 from tilting during placement or attachment to the semiconductor die 106. Furthermore, the arrangement of the first and second clip support members 122, 124 on the clip frame structure 104, rather than on the die attach structure 102 allows the die attach structure to remain substantially flat. This allows for low cost manufacture of the die attach structure 102.

The first and second clip support members 122, 124 extend from the heat sink portion 107 to contact the die attach structure 102. The first and second clip support members 122, 124 may be attached to the die attach structure 102 using any suitable bonding material such as a solder or a conductive adhesive.

Through a combination of the first and second clip support members 122, 124 at a first side of the clip frame structure 104, and the lead support member 114 on the opposite side of the clip frame structure 104, the first and second clip support members 122, 124 and the lead support member 114 prevent tilting of the clip frame structure 104 with respect to the semiconductor die 106. The first and second clip support members 122, 124 and the lead support member 114 therefore support the weight of the clip frame structure 104 acting downward on the solder or conductive adhesive and, in this way, heat sink portion 107 of the clip frame structure 104 is maintained substantially parallel to the top the surface of the semiconductor die 106. Therefore, the bond line thickness of the bonding material connecting the clip frame structure to the contact terminal of the semiconductor die 106 is substantially equal over the surface area of the contact terminal as illustrated in FIG. 1b and FIGS. 5a and 5b below.

As illustrated in FIG. 1c, the semiconductor die 106 and the clip frame structure 104 is then encapsulated using a moulding compound 126. The semiconductor die 106 and clip frame structure 104 is moulded so that first and second clip support members 122, 124 project through the mould compound 126 to contact the die attach structure 102. Likewise, the one or more leads 112, 116 and the lead support member 114 also project through the mould compound 126.

The clip frame structure 104, heat sink portion 107, first and second clip support members 122, 124, one or more leads 112, 116 and the lead support member 114 are typically formed from a single unitary sheet of metal, such as copper, which is formed or stamped to produce the desired structure. In this way the thickness of the each of the clip frame structure 104, first and second clip support members 122, 124, one or more leads 112 and the lead support member 114 will typically be equal. The choice of metal is entirely at the choice of the skilled person and may be chosen dependent on the required electrical characteristics of the semiconductor device 100.

In the arrangement of FIGS. 2a to 2c, a semiconductor die 106 is fixedly arranged on the die attach structure 102, and the clip frame structure 104 is fixedly connected to the semiconductor die 106 and the die attach structure 102, as described above with reference to FIGS. 1a to 1c. Like reference numerals of FIGS. 2a to 2c correspond to like features of FIGS. 1a to 1c. However, in the case of the arrangement of FIGS. 2a to 2c, heat sink portion 107 is thicker than first and second clip support members 122, 124, one or more leads 112, 116 and the lead support member 114. Whilst these features are typically formed from a single unitary sheet of metal, the heat sink portion 107 is formed to be thicker than the first and second clip support members 122, 124, one or more leads 112, 116 and the lead support member 114. This is illustrated in side view in FIG. 2b which shows the increased thickness of the heat sink portion 107 compared to the other features. The increased thickness of the heat sink portion 107 may result in increased thermal mass and thus improved heat sinking capability of the clip frame structure.

As the skilled person will realise, when compared to the embodiment of FIGS. 1a to 1c, the increased thickness of the heat sink 107 of FIGS. 2a to 2c will result in increased weight acting downwards on the solder or conductive adhesive. The first and second clip support members 122, 124 and the lead support member 114 therefore prevent tilting of the clip frame with respect to the semiconductor die 106 due to the increased weight of the clip frame structure acting downward on the solder or conductive adhesive. As discussed above this maintains the clip frame structure substantially parallel to the top of the semiconductor die 106. Therefore, the bond line thickness of the adhesive material connecting the heat sink portion 107 to the contact terminal of the semiconductor die 106 is substantially constant over the surface area of the top contact terminal 110 of the semiconductor die 106.

The semiconductor die 106 and the clip frame structure 104 are encapsulated using a moulding compound 126 as illustrated in FIG. 2c. The semiconductor die 106 and clip frame structure 104 are moulded so that first and second clip support members 122, 124 project through the mould compound 126. Likewise, the one or more leads 112, 116 and the lead support member 114 also project through the mould compound 126. Furthermore, due to the increased thickness of the clip frame structure 104 with the heat sink portion 107, the top surface of the heat sink portion 107 may be arranged to project and be exposed through the top surface of the mould compound 126. Furthermore, because of the above described arrangement of heat sink portion 107 being substantially parallel to the top of the semiconductor die 106, the top of the clip frame structure 104 with the heat sink portion 107 will be substantially level and parallel with the top surface of the mould compound 126.

Combined with the increased thickness of the clip frame structure 104 comprising the heat sink portion 107, and the top of heat sink portion 107 projecting and exposed through the top surface of the mould compound 126 as discussed above, the ability of the clip frame structure 104 to conduct heat away from the active semiconductor die 106 is increased because the whole top surface of the heat sink portion 107 is exposed and not covered by insulating mould compound 126.

As a result of the parallel and level nature of the clip frame structure 104 and heat sink portion 107 with the top surface of the mould compound 126, the exposed top surface of the clip frame structure 104 will be free of excessive mould flashes so that the need for grinding or polishing will be removed or reduced. The parallel and level nature of the clip frame structure 104 and heat sink portion 107 is achieved by a balanced (even across the whole surface of the clip) clamping pressure exerted by the clip frame structure 104 on the solder or conductive adhesive on the top side of the semiconductor die 106 thus achieving complete exposure of the top surface of the heat sink portion 107. Furthermore, because the top surface of the heat sink portion 107 is substantially free of so-called mould flashes the need for post processing, such as grinding, of the completed semiconductor device to remove the mould flashes is reduced.

The clip frame structures according to embodiments of FIGS. 1a to 1b and FIGS. 2a to 2c may further comprise one or more slits or holes 128 passing therethrough to allow ventilation of any solder gasses during attachment. These so-called out gassing holes prevent tilting and/or rotation of the clip due to upward pressure applied on the clip by gases produced during solder processes by allowing the gases to pass through the holes or slits 128.

Following moulding of the semiconductor device 100, the devices are singulated by severing the leads 112, 116 from the lead support member 114 and removal of the dam bar 128. The leads 112 are then formed by bending into their desired shape. The first and second clip support members 122, 124 are also severed so that they are no longer in contact with the die attach structure 102. In addition, the bottom external lead 103 is also singulated from the die attach structure 102.

Figure 3A:
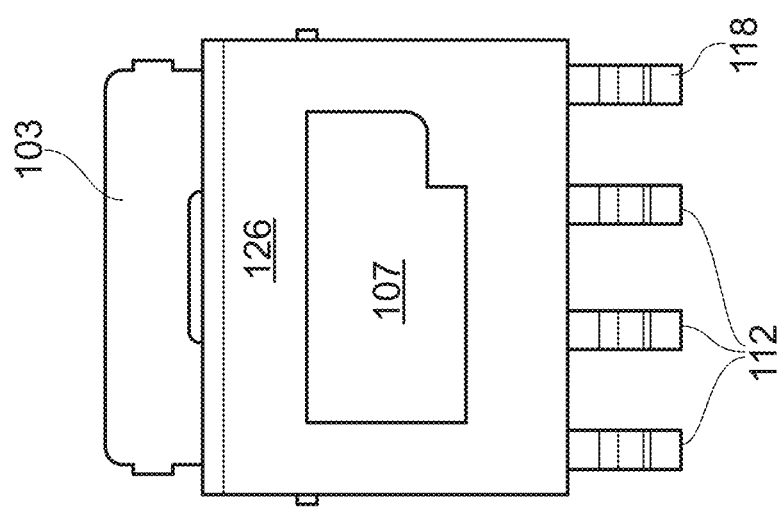
FIG. 3a illustrates a plan view of a completed semiconductor device according to embodiments.

Referring now to FIG. 3a, a singulated and completed semiconductor device 100 according to an embodiment is illustrated showing the leads 112, 118 and the bottom external lead 103. In addition, the severed first and second clip support members 122, 124 remain attached to the clip frame structure 104. The severed first and second clip support members 122, 124 are illustrated as protruding from the mould 126 of the semiconductor device, however, depending on the singulation technique they may be flush or level with the mould 126. The top surface of the clip frame structure 104 with the heat sink portion 107 projects and is exposed at the top surface of the mould compound 126 as described above.

The arrangement of FIGS. 4a and 4b is similar to that of FIGS. 3a and 3b, except that the top surface of the clip frame structure 104 does not project and is not exposed through the top surface of the mould compound 126, due to the comparably thinner heat sink portion 107. In other words the clip frame structure 104 and heat sink is embedded within the mould compound 126.

According to embodiments, the first leads 112 may form source connections to a source terminal 110 on top side of the semiconductor die 106. The second leads 116 may form a gate connection to a gate terminal 118 also formed on the top side of the semiconductor die 106. The bottom external lead 103 may form a drain connection to a drain terminal formed on the back side of the semiconductor die 106. In this regard, the semiconductor die 106 may be a field effect transistor.

Likewise, the semiconductor die 106 may be a bipolar junction transistor. The first leads 112 may form collector connections to a collector terminal 110 on the top side of the semiconductor die 106. The second lead 116 may form a base connection to a base terminal 118 also formed on the top side of the semiconductor die 108. The bottom external lead 103 may form an emitter connection to an emitter terminal formed on the back side of the semiconductor die 106.

FIG. 5a illustrates the arrangement of increased thickness of the clip frame structure 104 showing the heat sink portion 107 of FIGS. 2a to 2c and, 3a and 3b. When compared with the arrangement illustrated in FIGS. 1a to 1c and, 4a and 4b the top surface of the clip frame structure 104 comprising the heat sink portion 107, which is formed of a unitary piece of metal, is coplanar with the top of the mould 126 such that the clip frame structure 104 with the heat sink 107 is exposed through the mould material 126. As mentioned above, the semiconductor die 106 is attached to the die attach structure 102 using an appropriate bonding material, such as for example, a solder or a conductive adhesive and the clip frame structure 104 is attached to the semiconductor die 106 using a similar bonding material. The increased thickness of the clip frame structure 104 with the heat sink portion 107 exposed through the mould material 126 result in increased heat dissipation capability from the top side, for example the source region, of the semiconductor die 106.

FIG. 5b illustrates an alternative arrangement to that of FIG. 5a in which the clip frame structure 104 comprises an additional metal structure 109 arranged on the clip frame structure 104 to form the heat sink portion 107. As with the arrangement of FIG. 5a, the additional metal structure is coplanar with the top of the mould 126 such that the heat sink portion 107 is exposed through the mould material 126. Likewise, the semiconductor die 106 is attached to the die attach structure 102 using an appropriate bonding material, such as for example, a solder or a conductive adhesive and the clip frame structure 104 is attached to the semiconductor die 106 using a similar bonding material. The additional metal structure 109 is attached to the clip frame structure 104 using a similar adhesive material.

FIGS. 6a to 6c illustrate an alternative arrangement of the first and second clip support members 122, 124. In this arrangement the first clip support member 122 may be arranged to extend from a side of the clip frame structure 104 adjacent to the side from which the leads 112 extend. The second clip support member 124 may also extend from the from a side of the clip frame structure opposite the first clip support member 122. The first and second clip support member 122, 124 may be an extension of the dam bar 128. As with the arrangement of FIGS. 1a to 1c and FIGS. 2a to 2c, the function of the first and second clip support members 122, 124 is to provide support for the clip frame structure 104 on the die attach structure 102 and prevents the clip frame structure from tilting during placement or attachment to the semiconductor die 106. Furthermore, the arrangement of the first and second clip support members 122, 124 on the clip frame structure, rather than on the lead frame, allows the die attach structure to be formed substantially flat. This allows for low cost manufacture of the die attach structure. Furthermore, the formation first and second clip support members 122, 124 to be an extension of the dam bar 128 means that the second clip support members 122, 124 will be removed during the step of lead singulation and as a result the first and second clip support members 122, 124 will not extend through the mould material 126 following singulation. This can prevent any unwanted current leakage paths from the bottom external lead 103 to the clip frame structure. Moreover, an additional process step is not required to remove the first and second clip support member 122, 124 because they will be removed during removal of the dam bar 128.

Whilst FIGS. 6a to 6b illustrates the arrangement of increased thickness of the clip frame structure 104, the skilled person will understand that it is not so limited and is also applicable to the clip frame structures 104 of FIGS. 1a to 1c or FIG. 5c.

FIGS. 7a to 7g illustrate the process flow steps for manufacturing a semiconductor device according to an embodiment. The process begins at FIG. 7a, whereby a die attach structure 102 is provided. The process continues at FIG. 7b, whereby a bonding material such as solder or conductive paste is dispensed by, for example screen printing. Bonding material is dispensed on the die attach structure for attachment of: a semiconductor die 106 at a die attach portion 702; the later connection 704 of the first and second clip support members 122, 124 of clip frame structure; and the connection 706 of the support member 114. As shown in FIG. 7c semiconductor die 106 is then attached to the bonding material at the die attach portion 702 thus mechanically and electrically connecting a bottom contact of the semiconductor die 106 to the die attach structure 102. Following connection of the semiconductor die 106, bonding material is also dispensed on the one or more top contacts 708 of the semiconductor die 106. This allows the clip frame structure 104 to be electrically and mechanically connected to the one or more top contacts of the semiconductor die 106.

The process continues at FIG. 7e, whereby the clip frame structure is then attached to the die attach structure 102 and the semiconductor die 106. The clip frame structure 104 is aligned with the die attach structure 102 and the semiconductor die 106. The clip frame structure is thus connected to the bonding material 708 of the semiconductor die 106 forming electrical connections thereto. Also, the first and second clip support members 122, 124 are connected to the respective bonding material positions 704 on the die attach structure 102. Furthermore, the lead support member 114 of the clip frame structure 104 is connected to the bonding material position 706 on the die attach structure. In the case of solder, the die attach structure 102 and the clip frame structure 104 undergoes a reflow process and is allowed to cool to form the respective connections. As mentioned the skilled person will appreciate that the bonding material may be a solder, a conductive paste or an adhesive material. In the case of a conductive paste or adhesive the structure is cured to form the respective connections. From the above discussion, the clip frame structure 104 is thus mounted on the die attach structure 102 and the semiconductor die 106. The clip frame structure 104 is therefore supported in at least four positions, namely: the lead support member 114 at solder position 706; each of the first and second clip support members 122, 124 at respective solder positions 704; and on the one or more solder positions 708 on the semiconductor die 106.

Following the placement and attachment of the clip frame structure 104 the die is packaged in a mould material 126 as illustrated in FIG. 7g. The moulding process may be any appropriate moulding process such as cavity moulding or film assisted moulding.

Following moulding, as illustrated in FIG. 7g, the arrangement is then processed to separate the clip frame structure 104 from the die attach structure 102 using a process known as trim-form-singulation. This is achieved by removing the dam bar 128 and trimming the leads 112 from the support member 114. The tab portion 103 is also separated from the die attach structure 102. The first and second clip support members 122, 124 are also severed in line with the side of the mould 126. The leads 112 are then formed into their appropriate geometry and may optionally be plated.

In the above process flow discussion, two die attach structures 102 and two corresponding clip frame structures 104 are illustrated. However, the skilled person will understand that the number or arrangement of such structures is not so limited and is illustrative only. Any number or arrangement, such as a matrix or linear array, of structures may be provided. The skilled person will also appreciate that the above process is applicable for the arrangements of FIGS. 1a to 1c or FIGS. 6a to 6c. However, in the case of the arrangement of FIGS. 6a to 6c, the first and second clip support members 122, 124 will be removed at the same time as removal of the dam bar 128.

Figure 8A:
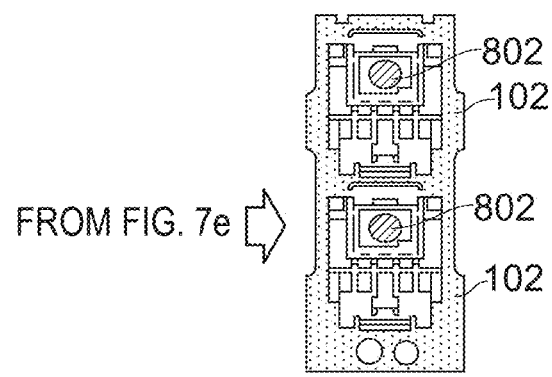
FIGS. 8a to 8d illustrate a process flow steps for manufacturing a semiconductor device according to an embodiment.
Figure 8D:
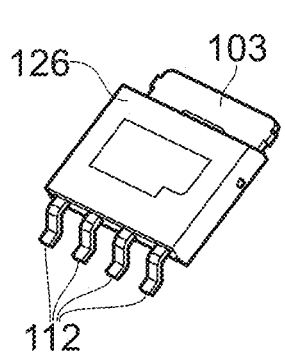
Figure 8C:
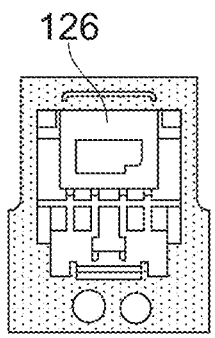
Figure 8B:
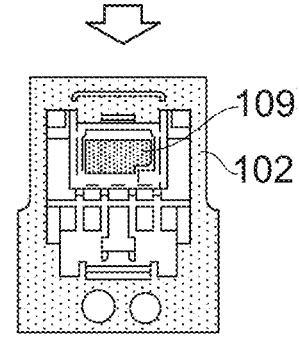

FIGS. 8a to 8d, illustrate process flow steps for manufacturing a semiconductor device according to the arrangement of FIG. 5c. The process flow is identical to that of FIGS. 7a to 7e. Following FIG. 7e, where the clip frame structure is attached to the die attach structure 102 and the semiconductor die 106, the process continues with FIG. 8a whereby solder 802 or conductive paste is dispensed by, for example screen printing on the clip frame structure over the semiconductor die 106. An additional metal structure 109 fixed on the clip frame structure 104 using the solder 802 as illustrated in FIG. 8b. The remaining process of FIGS. 8c to 8d is similar to that of FIGS. 7f and 7g.

With the foregoing in mind, the skilled person will see that various aspects of the above embodiments and process steps may be interchanged. For example the arrangement of support members 122, 124 extending from the dam bar 128 may be used with the arrangement of heat sink portion 107 of FIGS. 1a to 1c and 5c.

Optionally, after the moulding process the top of the semiconductor device may be polished to remove any excess mould compound from the exposed clip frame structure.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A lead frame assembly for a semiconductor device, the lead frame assembly comprising:
   a die attach structure and a clip frame structure;
   the clip frame structure comprising:
   a die connection portion configured and arranged to contact to one or more contact terminals on a top side of a semiconductor die;
   one or more electrical leads extending from the die connection portion at a first end, and a lead supporting member extending from a second end distal to the first end of the one or more leads; and
   a plurality of clip support members comprising a first clip support member arranged to extend to one side of the die connection portion and a second clip support member arranged to extend to another side of the die connection portion, wherein the plurality of clip support members are arranged orthogonally to opposite sides of the one or more electrical leads, wherein the plurality of clip support members and the lead supporting member are configured and arranged to contact the die attach structure.

2. The lead frame assembly of claim 1, wherein the plurality of clip support members are arranged on the die connection portion.

3. The lead frame assembly of claim 2, further comprising a dam bar extending orthogonally across the one or more electrical leads, wherein each one of the clip support members are integrally formed at a respective end of the dam bar.

4. The lead frame assembly of claim 1, wherein the plurality of clip support members are arranged on the one or more electrical leads between the die connection portion and the lead supporting member.

5. The lead frame assembly of claim 1, wherein the clip frame structure is formed of a single unitary piece of conductive material.

6. The lead frame assembly of claim 1, further comprising a heat sink member arranged on the die connection portion.

7. A semiconductor device comprising the lead frame assembly of claim 6, wherein the semiconductor die is arranged on the die attach structure and a moulding material encases the semiconductor die; and
   wherein the heat sink member has a top surface that is substantially coplanar with a top surface of the moulding material.

8. The semiconductor device of claim 7, wherein the heat sink member is attached to the die connection portion using a bonding material.

9. The semiconductor die of claim 7, wherein the die attach structure is attached to a backside contact portion of the semiconductor die using a bonding material.

10. A semiconductor device comprising the lead frame assembly of claim 1, and further comprising a semiconductor die arranged on the die attach structure and a moulding material encasing the semiconductor die.

11. The semiconductor device of claim 10, wherein the die connection portion is connected to the top side contact portion of the semiconductor die using a bonding material.

12. The semiconductor device of claim 11, wherein the bonding material has a thickness that is substantially equal across an area of the bond.

13. The semiconductor device of claim 12, wherein the die connection portion is substantially parallel to the top side of the semiconductor die.

14. The semiconductor device of claim 11, wherein the die connection portion is substantially parallel to the top side of the semiconductor die.

15. The semiconductor device of claim 10, wherein the die connection portion is substantially parallel to a top side of the semiconductor die.

16. The semiconductor die of claim 10, wherein the die attach structure is attached to a backside contact portion of the semiconductor die using a bonding material.

17. The semiconductor die of claim 16, wherein the die attach structure is attached to a backside contact portion of the semiconductor die using a bonding material.

18. A method of manufacturing a semiconductor device, the method comprising: providing a die attach structure; fixing a semiconductor die to the die attach structure; and attaching a clip frame structure to the die attach structure and the semiconductor die, wherein the clip frame structure comprises:
   a die connection portion configured and arranged to contact to one or more contact terminals on a top side of the semiconductor die;
   one or more electrical leads extending from the die connection portion at a first end, and a lead supporting member extending from a second end distal to the first end of the one or more leads; and
   a plurality of clip support members comprising a first clip support member arranged to extend to one side of the die connection portion and second clip support member arranged to extend to another side of the die connection portion, wherein the plurality of clip support members are arranged orthogonally to opposite sides of the one or more electrical leads, wherein the plurality of clip support members and the lead support members are configured and arranged to contact the die attach structure.

19. The method of claim 18, wherein the clip support members are fixedly connected to the die attach structure.

* * * * *